United States Patent
Ettinger et al.

(10) Patent No.: US 8,635,784 B2
(45) Date of Patent: Jan. 28, 2014

(54) METHODS AND APPARATUS FOR DRYING A SUBSTRATE

(75) Inventors: Gary C. Ettinger, Cupertino, CA (US);
Michael E. Khau, Milpitas, CA (US);
Ho Seon Shin, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1264 days.

(21) Appl. No.: 11/538,302

(22) Filed: Oct. 3, 2006

(65) Prior Publication Data
US 2007/0094886 A1    May 3, 2007

Related U.S. Application Data

(60) Provisional application No. 60/723,706, filed on Oct. 4, 2005.

(51) Int. Cl.
*F26B 5/08*    (2006.01)
(52) U.S. Cl.
USPC .............. 34/78; 34/80; 271/267; 414/795
(58) Field of Classification Search
USPC .............. 34/351, 381, 77, 48, 19, 80, 90; 414/782, 795; 271/267
See application file for complete search history.

(56) References Cited

U.S. PATENT DOCUMENTS

| | | | | |
|---|---|---|---|---|
| 3,223,395 A | * | 12/1965 | Genbauffe | 432/44 |
| 3,239,945 A | * | 3/1966 | Cobb et al. | 34/527 |
| 4,449,885 A | * | 5/1984 | Hertel et al. | 414/416.08 |
| 4,453,757 A | * | 6/1984 | Soraoka | 294/119.1 |
| 4,540,034 A | * | 9/1985 | Young | 150/137 |
| 4,542,426 A | * | 9/1985 | Wilkinson et al. | 360/99.12 |
| 4,553,069 A | * | 11/1985 | Purser | 315/111.81 |
| 4,610,475 A | * | 9/1986 | Heiserman | 294/86.4 |
| 4,622,903 A | * | 11/1986 | Warren et al. | 110/221 |
| 4,681,213 A | * | 7/1987 | Winiasz | 198/803.9 |
| 4,715,637 A | * | 12/1987 | Hosoda et al. | 294/86.4 |
| 4,752,180 A | * | 6/1988 | Yoshikawa | 414/737 |
| 4,773,687 A | * | 9/1988 | Bush et al. | 294/64.1 |

(Continued)

FOREIGN PATENT DOCUMENTS

| | | | |
|---|---|---|---|
| EP | 0 385 536 B1 | | 9/1994 |
| JP | 362036247 | * | 2/1987 |

(Continued)

OTHER PUBLICATIONS

International Search Report and Written Opinion of International Application No. PCT/US06/39172 mailed Apr. 10, 2007.

(Continued)

*Primary Examiner* — Steve M Gravini
(74) *Attorney, Agent, or Firm* — Dugan & Dugan, PC (57) ABSTRACT

In a first aspect, a method of drying at least a portion of a substrate located within a fluid is provided. The method includes contacting an edge of the substrate that is located within the fluid with a pusher pin. The pusher pin has (a) a shaft portion; and (b) a tip portion having a knife edge of a width of 0.42 inches or less, the tip portion adapted to contact and support the substrate with the knife edge. The method further includes lifting the substrate from the fluid with the pusher pin; and exposing the substrate to a drying vapor as the substrate is lifted from the fluid. Numerous other aspects are provided.

22 Claims, 6 Drawing Sheets

(56) References Cited

U.S. PATENT DOCUMENTS

| | | | | |
|---|---|---|---|---|
| 4,777,970 A * | 10/1988 | Kusuhara | | 134/66 |
| 4,823,654 A * | 4/1989 | Moore | | 81/488 |
| 4,839,947 A * | 6/1989 | Cohen et al. | | 24/499 |
| 4,858,764 A * | 8/1989 | Domokos | | 206/449 |
| 4,858,980 A * | 8/1989 | Dreisig et al. | | 294/99.1 |
| 5,001,594 A * | 3/1991 | Bobbio | | 361/234 |
| 5,046,909 A * | 9/1991 | Murdoch | | 294/113 |
| 5,054,834 A * | 10/1991 | Alessandri et al. | | 294/87.1 |
| 5,121,908 A * | 6/1992 | Shatkus et al. | | 269/99 |
| 5,191,908 A * | 3/1993 | Hiroe et al. | | 134/76 |
| 5,240,753 A * | 8/1993 | Tabuchi et al. | | 428/36.4 |
| 5,339,539 A * | 8/1994 | Shiraishi et al. | | 34/58 |
| 5,351,415 A * | 10/1994 | Brooks et al. | | 34/389 |
| 5,398,360 A * | 3/1995 | Alexander | | 7/158 |
| 5,435,075 A * | 7/1995 | Shiraishi et al. | | 34/58 |
| 5,547,515 A * | 8/1996 | Kudo et al. | | 134/21 |
| 5,555,634 A * | 9/1996 | Uchiyama et al. | | 34/78 |
| 5,566,466 A * | 10/1996 | Hearne | | 34/58 |
| 5,634,978 A * | 6/1997 | Mohindra et al. | | 134/2 |
| 5,647,626 A * | 7/1997 | Chen et al. | | 294/87.1 |
| 5,692,873 A * | 12/1997 | Weeks et al. | | 414/627 |
| 5,699,211 A * | 12/1997 | Magnusson et al. | | 360/271.5 |
| 5,700,046 A * | 12/1997 | Van Doren et al. | | 294/119.1 |
| 5,746,460 A * | 5/1998 | Marohl et al. | | 294/1.1 |
| 5,765,890 A * | 6/1998 | Gaylord et al. | | 294/65 |
| 5,787,561 A * | 8/1998 | Harmand | | 29/255 |
| 5,807,062 A * | 9/1998 | Schultz et al. | | 414/744.2 |
| 5,836,575 A * | 11/1998 | Robinson et al. | | 269/317 |
| 5,851,041 A * | 12/1998 | Anderson et al. | | 294/106 |
| 5,934,865 A * | 8/1999 | Meadows | | 414/796.9 |
| 5,955,858 A * | 9/1999 | Kroeker et al. | | 318/568.11 |
| 5,958,146 A * | 9/1999 | Mohindra et al. | | 134/2 |
| 5,960,562 A * | 10/1999 | Nishida et al. | | 34/574 |
| 5,968,442 A | 10/1999 | Sato et al. | | |
| 5,984,391 A * | 11/1999 | Vanderpot et al. | | 294/1.1 |
| 6,012,472 A | 1/2000 | Leenaars et al. | | |
| 6,026,589 A * | 2/2000 | Yao et al. | | 34/78 |
| 6,036,426 A * | 3/2000 | Hillman | | 414/331.14 |
| D422,866 S * | 4/2000 | Jahani et al. | | D8/71 |
| 6,053,688 A * | 4/2000 | Cheng | | 414/416.03 |
| 6,075,334 A * | 6/2000 | Sagues et al. | | 318/568.11 |
| 6,077,026 A * | 6/2000 | Shultz | | 414/744.1 |
| 6,086,976 A * | 7/2000 | Gardner et al. | | 428/131 |
| 6,089,748 A * | 7/2000 | McDermott et al. | | 366/262 |
| 6,112,735 A * | 9/2000 | Farnworth | | 125/12 |
| 6,116,848 A * | 9/2000 | Thomas et al. | | 414/754 |
| 6,119,367 A * | 9/2000 | Kamikawa et al. | | 34/401 |
| 6,120,360 A * | 9/2000 | Ball et al. | | 451/65 |
| 6,123,502 A * | 9/2000 | Adams et al. | | 414/752.1 |
| 6,134,807 A * | 10/2000 | Komino et al. | | 34/418 |
| 6,139,645 A | 10/2000 | Leenaars et al. | | |
| 6,158,941 A * | 12/2000 | Muka et al. | | 414/222.12 |
| 6,164,297 A * | 12/2000 | Kamikawa | | 134/61 |
| 6,174,011 B1 * | 1/2001 | Keigler | | 294/99.1 |
| 6,182,376 B1 * | 2/2001 | Shin et al. | | 34/418 |
| 6,208,510 B1 | 3/2001 | Trudeau et al. | | |
| 6,231,297 B1 * | 5/2001 | Hofmeister | | 414/744.5 |
| 6,257,827 B1 * | 7/2001 | Hendrickson et al. | | 414/805 |
| 6,261,048 B1 * | 7/2001 | Muka | | 414/416.03 |
| 6,263,587 B1 * | 7/2001 | Raaijmakers et al. | | 34/404 |
| 6,269,000 B1 | 7/2001 | McCarrol | | |
| 6,276,072 B1 * | 8/2001 | Morad et al. | | 34/428 |
| 6,299,404 B1 * | 10/2001 | Muka et al. | | 414/744.5 |
| 6,340,090 B1 * | 1/2002 | Jahani et al. | | 211/41.1 |
| 6,357,143 B2 * | 3/2002 | Morad et al. | | 34/412 |
| 6,364,592 B1 * | 4/2002 | Hofmeister | | 414/217 |
| 6,374,512 B1 * | 4/2002 | Guo et al. | | 34/362 |
| 6,427,359 B1 * | 8/2002 | Scranton et al. | | 34/444 |
| 6,473,668 B2 | 10/2002 | Abuzeid et al. | | |
| 6,477,786 B1 * | 11/2002 | Jones et al. | | 34/228 |
| 6,477,787 B2 * | 11/2002 | Morad et al. | | 34/412 |
| 6,533,872 B1 | 3/2003 | Leenaars et al. | | |
| 6,543,461 B2 * | 4/2003 | Haimovich et al. | | 134/61 |
| 6,558,562 B2 * | 5/2003 | Mallery et al. | | 216/38 |
| 6,578,893 B2 * | 6/2003 | Soucy et al. | | 294/99.1 |
| 6,632,751 B2 * | 10/2003 | Mertens et al. | | 438/800 |
| 6,647,642 B2 * | 11/2003 | Kamikawa et al. | | 34/490 |
| 6,658,763 B2 * | 12/2003 | Morad et al. | | 34/412 |
| 6,690,575 B1 | 2/2004 | Banton et al. | | |
| 6,776,602 B2 * | 8/2004 | Swanson et al. | | 425/376.1 |
| 6,797,029 B2 | 9/2004 | Lederer et al. | | |
| 6,822,861 B2 | 11/2004 | Meir | | |
| 6,889,447 B2 * | 5/2005 | Lee et al. | | 34/403 |
| 6,908,512 B2 * | 6/2005 | Ivanov et al. | | 118/503 |
| 6,929,774 B2 * | 8/2005 | Morad et al. | | 266/81 |
| 6,932,557 B2 * | 8/2005 | Downs et al. | | 414/741 |
| 6,988,327 B2 * | 1/2006 | Garcia et al. | | 34/407 |
| 7,017,281 B2 * | 3/2006 | Izumi | | 34/565 |
| 7,112,961 B2 * | 9/2006 | Lei et al. | | 324/230 |
| 7,127,831 B2 * | 10/2006 | Garcia et al. | | 34/407 |
| 7,344,352 B2 * | 3/2008 | Gueler | | 414/740 |
| 7,355,394 B2 * | 4/2008 | Lei et al. | | 324/230 |
| 7,364,625 B2 * | 4/2008 | Christenson et al. | | 134/2 |
| 7,374,712 B2 * | 5/2008 | Swanson et al. | | 264/308 |
| 7,390,458 B2 * | 6/2008 | Burow et al. | | 422/63 |
| 7,392,599 B2 * | 7/2008 | Ishihara | | 34/381 |
| 7,395,611 B2 * | 7/2008 | Garcia et al. | | 34/77 |
| 7,422,411 B2 * | 9/2008 | Downs et al. | | 414/741 |
| 2001/0037586 A1 * | 11/2001 | Sutton et al. | | 34/444 |
| 2002/0007567 A1 * | 1/2002 | Morad et al. | | 34/412 |
| 2002/0043272 A1 * | 4/2002 | Mohindra et al. | | 134/3 |
| 2002/0073576 A1 * | 6/2002 | Kamikawa et al. | | 34/448 |
| 2002/0116836 A1 * | 8/2002 | Morad et al. | | 34/62 |
| 2003/0131495 A1 * | 7/2003 | Morad et al. | | 34/412 |
| 2003/0233764 A1 * | 12/2003 | Lee et al. | | 34/259 |
| 2004/0040177 A1 * | 3/2004 | Izumi | | 34/492 |
| 2004/0060195 A1 * | 4/2004 | Garcia et al. | | 34/445 |
| 2004/0154185 A1 * | 8/2004 | Morad et al. | | 34/412 |
| 2005/0198857 A1 * | 9/2005 | Nakazawa et al. | | 34/391 |
| 2006/0123658 A1 * | 6/2006 | Izumi | | 34/565 |
| 2006/0150435 A1 * | 7/2006 | Garcia et al. | | 34/381 |
| 2007/0011905 A1 * | 1/2007 | Garcia et al. | | 34/381 |
| 2007/0094886 A1 * | 5/2007 | Ettinger et al. | | 34/239 |
| 2007/0220775 A1 * | 9/2007 | Miya | | 34/351 |
| 2008/0052947 A1 * | 3/2008 | Miya | | 34/317 |
| 2008/0141556 A1 * | 6/2008 | Sorabji et al. | | 34/380 |
| 2009/0019722 A1 * | 1/2009 | Nakazawa et al. | | 34/391 |

FOREIGN PATENT DOCUMENTS

| | | |
|---|---|---|
| JP | H02-291128 | 11/1990 |
| JP | 2000-306881 | 11/2000 |
| JP | 2002-502109 | 1/2002 |
| TW | 200411722 | 7/2004 |

OTHER PUBLICATIONS

International Preliminary Report on Patentability of International Application No. PCT/US06/39172 mailed Apr. 17, 2008.
Search Report of Taiwan Application No. 95136931 dated Apr. 29, 2010.

* cited by examiner

METHODS AND APPARATUS FOR DRYING A SUBSTRATE

The present application claims priority from U.S. Provisional Patent Application Ser. No. 60/723,706, filed Oct. 4, 2005, which is hereby incorporated by reference herein in its entirety.

FIELD OF THE INVENTION

The present invention relates generally to substrate processing, and more particularly to methods and apparatus for drying a substrate.

BACKGROUND

Following substrate cleaning, a substrate may be dried by lifting the substrate from a fluid, such as deionized water, past an isopropyl alcohol drying vapor. Such a drying process may dry substantially all of a substrate without leaving water marks. However, water marks may form along an edge region of the substrate that is contacted as the substrate is removed from the fluid. Accordingly, a need exists for improved methods and apparatus for drying a substrate without forming water marks along an edge region of the substrate.

SUMMARY OF THE INVENTION

In a first aspect of the invention, a pusher pin is provided for use during substrate drying. The pusher pin includes (1) a shaft portion; and (2) a tip portion having a knife edge of a width of 0.42 inches or less, the tip portion adapted to contact and support a substrate with the knife edge.

In a second aspect of the invention, a method of drying at least a portion of a substrate located within a fluid is provided. The method includes contacting an edge of the substrate that is located within the fluid with a pusher pin. The pusher pin has (a) a shaft portion; and (b) a tip portion having a knife edge of a width of 0.42 inches or less, the tip portion adapted to contact and support the substrate with the knife edge. The method further includes lifting the substrate from the fluid with the pusher pin; and exposing the substrate to a drying vapor as the substrate is lifted from the fluid.

In a third aspect of the invention, a system for drying a substrate is provided. The system includes (1) a tank adapted to contain a fluid; (2) a drying vapor delivery system adapted to expose the substrate to a drying vapor as the substrate is lifted from the fluid; and (3) a pusher pin. The pusher pin includes (a) a shaft portion; and (b) a tip portion having a knife edge of a width of 0.42 inches or less, the tip portion adapted to contact and support the substrate with the knife edge. The pusher pin is adapted to lift the substrate from the fluid while the substrate is exposed to drying vapor from the drying vapor delivery system.

Numerous other aspects are provided in accordance with these and other aspects of the invention.

Other features and aspects of the present invention will become more fully apparent from the following detailed description, the appended claims and the accompanying drawings.

DETAILED DESCRIPTION

The present invention provides methods and apparatus for improving substrate cleaning. In at least one embodiment, a pusher pin is provided that may lift a substrate from a fluid past a drying vapor (during Marangoni drying) while reducing an amount of fluid residue remaining on the substrate after drying. For example, a tip of the pusher pin may be dimensioned so as to reduce an amount of drying vapor blocked by the tip while the pusher pin lifts the substrate from the fluid (compared to conventional devices used to lift substrates from a fluid during Marangoni drying).

FIGS. 1-3A are an isometric view, a front view and a side view, respectively, of a first exemplary pusher pin 101 in accordance with an embodiment of the present invention. With reference to FIGS. 1-3A, the pusher pin 101 may include a shaft 103 and a tip 105 (FIG. 3B illustrates an enlarged portion of an exemplary embodiment of the tip 105 of the pusher pin of FIGS. 1-3A). The shaft 103 may have a height h1 of about 0.65 in., a diameter d1 of about 0.32 in. and a flat 106 having a length l1 of about 0.25 in. However, the shaft may be dimensioned differently. For example, the shaft 103 may have a larger or smaller height h1, diameter d1 and/or length l1. In some embodiments, the shaft 103 may be formed from Polyetheretherketone (PEEK) or another suitable material.

Figure 1:
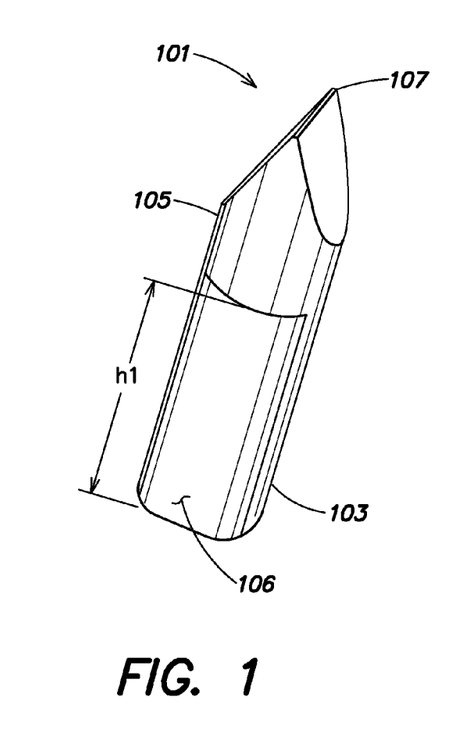
FIG. 1 is an isometric view of a first exemplary pusher pin in accordance with an embodiment of the present invention.
Figure 2:
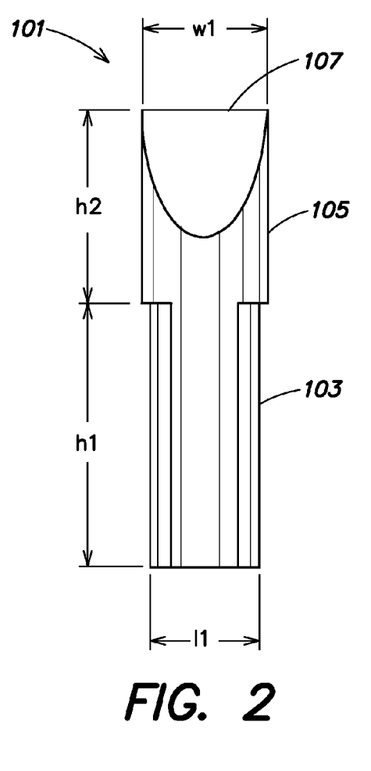
FIG. 2 is a front view of the first exemplary pusher pin in accordance with an embodiment of the present invention.
Figure 3A:
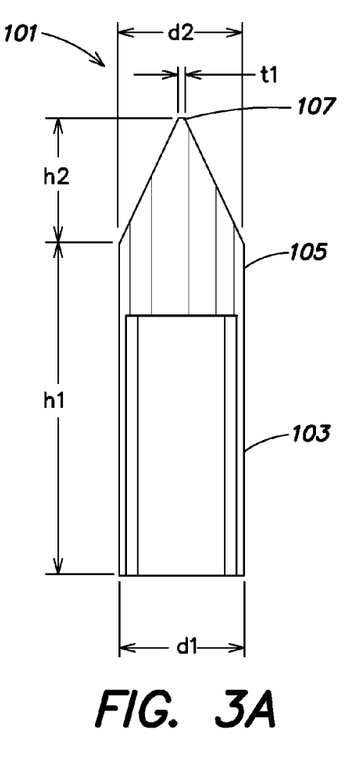
FIG. 3A is a side view of the first exemplary pusher pin in accordance with an embodiment of the present invention.

The tip 105 may have a height h2 of about 0.485 in. and a base of diameter d2 of about 0.32 in. which tapers to a knife edge 107 (described below). Further, the tip 105 may have a width w1 of between about 0.25 in. and about 0.5 in., preferably about 0.42 in. or less and more preferably about 0.32 in. or less. However, the tip 105 may be dimensioned differently. For example, the tip 105 may have a larger or smaller height h2 and/or diameter d2. Additionally or alternatively, a larger or smaller range and/or different range may be employed for the width w1. In some embodiments, the tip 105 may be formed from Polysulfone or another suitable material. The knife edge 107 may have a thickness t1 of about 0.005 in. (although a larger or smaller thickness may be employed). The shaft 103, tip 105 and/or knife edge 107 may be integrally formed (e.g., as a single piece) or separate pieces coupled together.

Figure 3B:
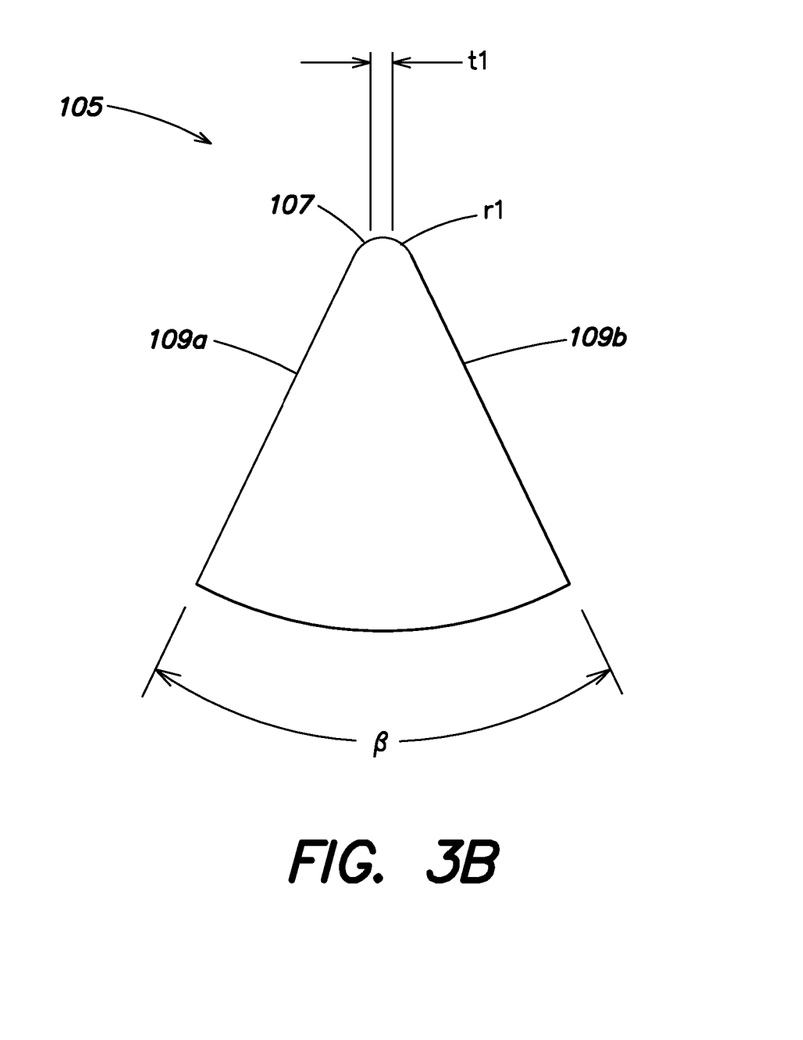
FIG. 3B illustrates an enlarged portion of an exemplary embodiment of the tip of the pusher pin of FIGS. 1-3A.

FIG. 3B illustrates an exemplary embodiment of the tip 105 in which the knife edge 107 is formed via radii r1 of about 0.005+/−0.003 inches so as to create a thickness t1 of about 0.005+/−0.002 inches for the knife edge 107. Also, tapered sides 109a, 109b of the knife edge 107 are angled relative to one another by an angle β of about 51-52 degrees. Other knife edge thicknesses t1, radii r1 and/or angles β may be used.

The knife edge 107 is shaped so as to reduce a material thickness (t1) on which a substrate edge may rest when the substrate is lifted from a fluid (compared to conventional lifting devices), thereby reducing an interface formed between the knife edge 107 and the substrate. A narrow diameter d2 and/or width w1 of the tip 105 may prevent the pusher pin 101 from blocking a drying vapor during Marangoni drying as described further below. A narrow width w1 also may reduce trapping of fluid between a substrate and the knife edge 107 (as also described below).

Figure 4:
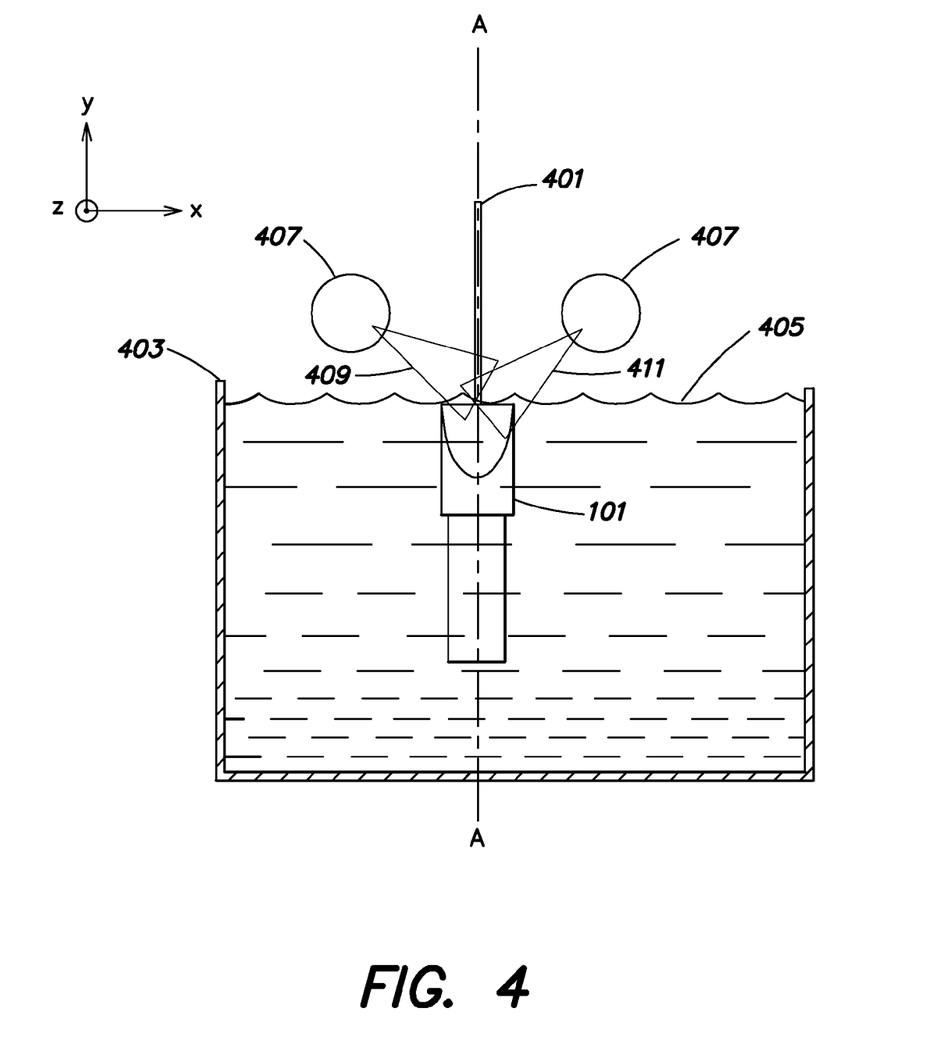
FIG. 4 illustrates a first exemplary system for substrate cleaning in accordance with an embodiment of the present invention.

The operation of the first exemplary pusher pin 101 is now described with reference to FIG. 4 which illustrates a first exemplary system for substrate cleaning in accordance with an embodiment of the present invention. With reference to FIG. 4, during processing a substrate 401 may be immersed in a processing module (tank) 403 (e.g., an IPA vapor dryer). The processing module 403 may include fluid 405 such as water (e.g., deionized water) or another suitable cleaning and/or rinsing fluid. The processing module 403 may include a drying vapor delivery system such as one or more spray bars 407 or another suitable mechanism adapted to spray a drying vapor such as IPA vapor or another suitable fluid (in respective spray patterns 409-411) near the interface formed by the substrate 401, the fluid 405 in the processing module 403 and air (e.g., as part of a Marangoni drying process).

The processing module 403 may include the first exemplary pusher pin 101 adapted to lift the substrate 401 from the fluid 405 in the processing module 403. As the substrate 401 is lifted from the processing module 403 by the pusher pin 401, IPA or another drying vapor may be sprayed from the one or more spray bars 407 at the substrate/fluid/air interface. Benefits of spraying IPA vapor near an interface formed by the fluid 405 in the processing module 403, air and/or the substrate 401 while removing the substrate 401 from the processing module 403, such as reduced fluid surface tension, are well known.

The dimensions and/or shape of the first exemplary pusher pin 101, such as the knife edge 107, (1) enable the pusher pin 101 to lift the substrate 401 from the processing module 403 without significantly blocking drying vapor from reaching the interface formed by the air, the fluid 405 and/or the substrate 401; and/or (2) prevent fluid from being trapped at the pusher pin 101/substrate 401 contact location as might be the case if a grooved shaped or similar pushing (lifting) device were employed to lift the substrate 401 from the fluid 405. Consequently, the drying vapor may effectively reduce fluid surface tension as the pusher pin 101 lifts the substrate 401 from the fluid 405 of the processing module 403, and an amount of fluid residue remaining on the substrate 401 after Marangoni drying is reduced. For example, the present methods and apparatus may prevent formation of one or more water spots that would typically remain on a bottom area of the substrate 401 (e.g., near a "6 o'clock" position) when using conventional methods and apparatus.

Figure 5:
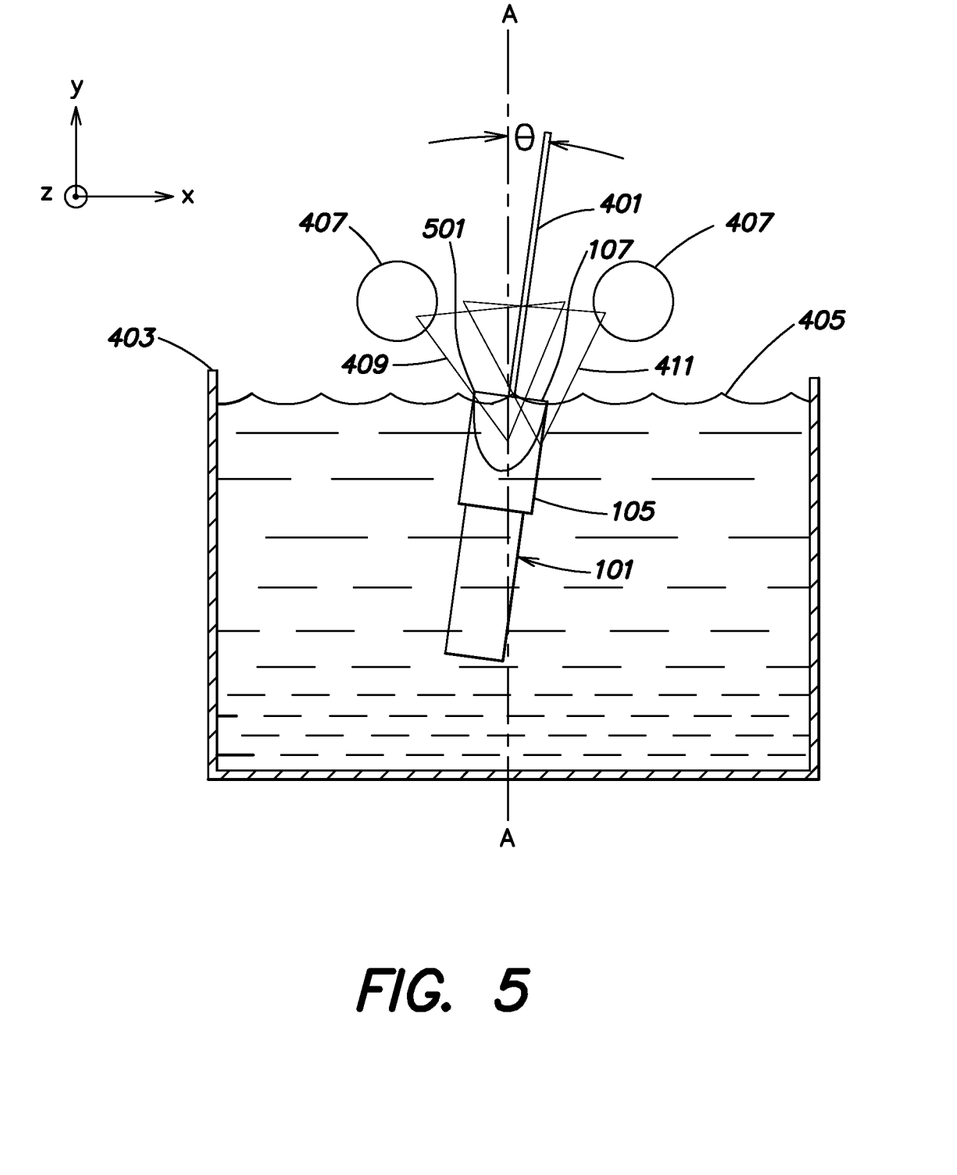
FIG. 5 illustrates a second exemplary system for substrate cleaning in accordance with an embodiment of the present invention.

The first exemplary pusher pin 101 may lift the substrate 401 from the processing module 403 such that a plane including the substrate 401 is parallel with a vertical axis A (e.g., a y-axis) as shown in FIG. 4. However, in accordance with another embodiment of the present invention, the first exemplary pusher pin 101 may lift the substrate 401 from the processing module 403 such that a plane including the substrate 401 forms an angle with the vertical axis A. For example, FIG. 5 illustrates a second exemplary system for substrate cleaning in accordance with an embodiment of the present invention. With reference to FIG. 5, in accordance with the second embodiment, during the Marangoni drying process, the first exemplary pusher pin 101 may be lifted from the processing module 403 in a manner similar to that described with reference to FIG. 4. However, in the system of FIG. 5 the first exemplary pusher pin 101 lifts the substrate 401 from the processing module 403 such that a plane including the substrate 401 forms an angle θ with the vertical axis A. In some embodiments, the first exemplary pusher pin 101 may lift the substrate 401 from the processing module 403 such that a plane including the substrate 401 forms an angle θ of between about 1° to about 15°, and preferably about 9° with the vertical axis A (although a larger or smaller angle may be employed). Use of such an angle may decouple the entrance and exit of a Marangoni dryer as described, for example, in U.S. patent application Ser. No. 10/286,404 filed Nov. 1, 2002, which is hereby incorporated by reference herein in its entirety. In such an embodiment, employing a narrow width w1 for the knife edge 107 (e.g., about 0.42 inches or less, and more preferably about 0.32 inches or less) reduces shadowing of drying vapor by the knife edge 107 and/or fluid trapping by the knife edge 107 along a portion 501 of the knife edge 107 during lifting of the substrate 401 with the pusher pin 101. A sufficient area for contacting and supporting the substrate is nonetheless provided.

Figure 6A:
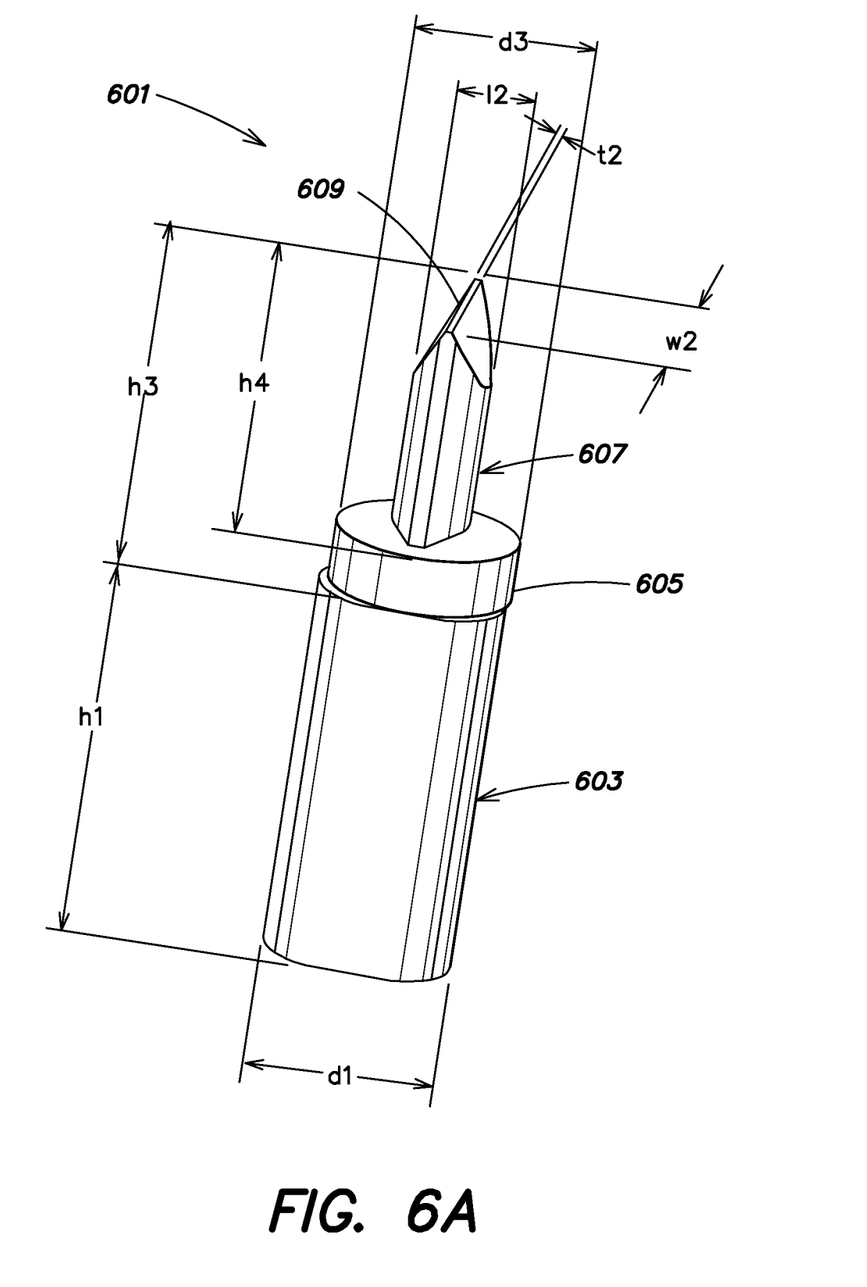
FIG. 6A is an isometric view of a second exemplary pusher pin in accordance with an embodiment of the present invention.

FIG. 6A is an isometric view of a second exemplary pusher pin 601 in accordance with an embodiment of the present invention. With reference to FIG. 6A, a shaft 603 of the second exemplary pusher pin 601 may be similar to the shaft 103 of the first exemplary pusher pin 101. However, in contrast to the first exemplary pusher pin 101, a tip 605 of the second exemplary pusher pin 601 may be offset from its shaft 603 as shown. The tip 605 may have a height h3 of about 0.495 in. and a base having a diameter d3 of about 0.32 in., although other sizes may be employed.

The tip 605 may include a top portion 607 which tapers to a knife edge 609 (described below). The top portion 607 may have a height h4 of about 0.395 in., a length l2 of about 0.125 in., a width w2 of between about 0.25 in. and about 0.5 in., preferably about 0.42 inches or less and more preferably about 0.32 inches or less, and a thickness t2 of about 0.005 in. However, the second exemplary pusher pin 601 may be dimensioned differently. For example, a larger or smaller and/or different height h4, length l2, width w2 and/or thickness t2 may be employed. In some embodiments, the tip 601 may be formed from PEEK or another suitable material.

Figure 6B:
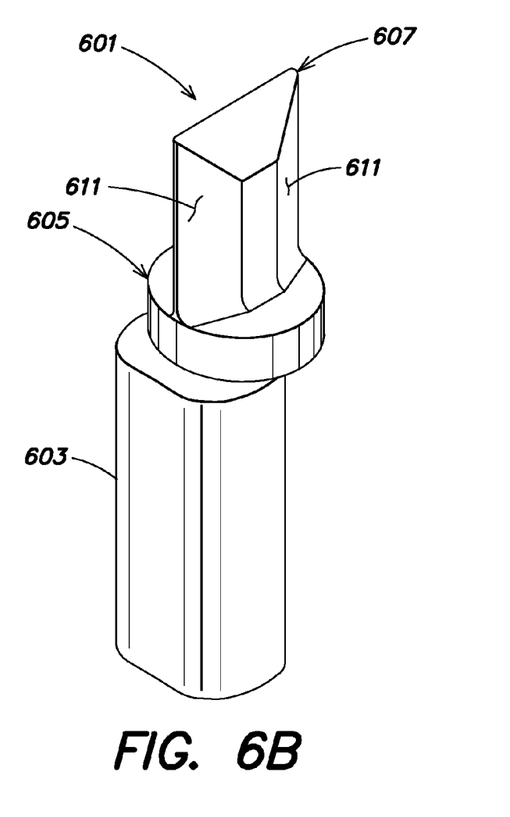
FIGS. 6B-6C are an isometric view and top cross-sectional view, respectively, of the second exemplary pusher pin of FIG. 6A.
Figure 6C:
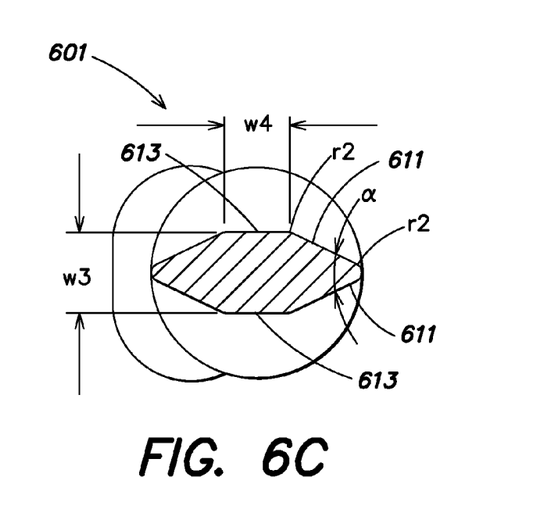

FIGS. 6B-6C are an isometric view and top cross-sectional view, respectively, of the second exemplary pusher pin 601 in which chamfered sides 611 are employed. With reference to FIGS. 6B-6C, the top portion 607 of the tip 605 of the second pusher pin 601 has a width w3 of about 0.125 inches, and a flat 613 having width w4 of about 0.1 inches. Opposing sides 611 are separated by an angle α of about 49 degrees, and are coupled to the flat 613 and/or to each other using radii r2 of about 0.015 inches. The tip 605 has an overall diameter of about 0.32 inches. Other widths w3 and/or w4, angles α, radii r2 and/or tip diameters may be used.

Figure 6D:
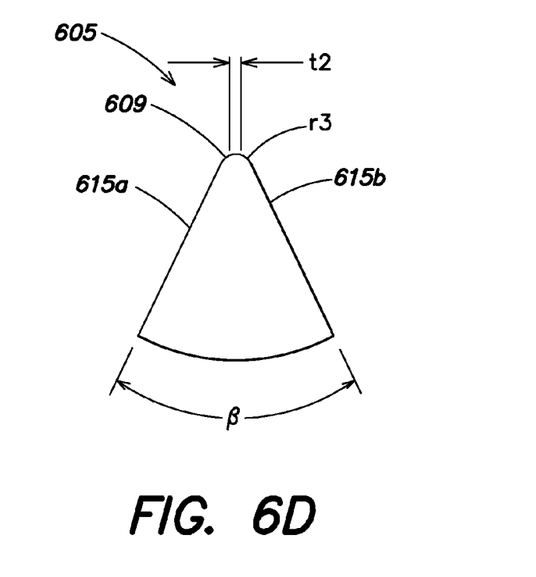
FIG. 6D illustrates an exemplary embodiment of the tip of the pusher pin of FIG. 6A in which the knife edge is formed via radii.

FIG. 6D illustrates an exemplary embodiment of the tip 605 in which the knife edge 609 is formed via radii r3 of about 0.005+/−0.003 inches so as to create a thickness t2 of about 0.005+/−0.002 inches for the knife edge 609. Also, tapered sides 615a, 615b of the knife edge 609 are angled relative to one another by an angle β of about 51-52 degrees. Other knife edge thicknesses t2, radii r3 and/or angles β may be used.

Figure 6E:
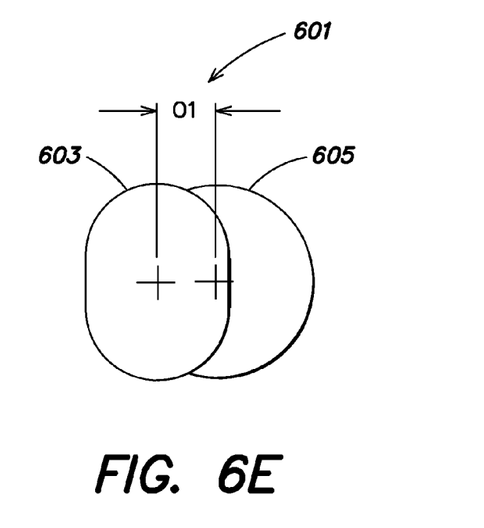
FIG. 6E is a bottom view of an exemplary embodiment of the pusher pin of FIG. 6A.

FIG. 6E is a bottom view of an exemplary embodiment of the pusher pin 601 which illustrates an offset O1 between the shaft 603 and the tip 605. In at least one embodiment of the invention, the offset O1 may be about 0.094+/−0.002 inches, although other offset values may be used.

The second exemplary pusher pin 601 may be employed in a manner similar to the first pusher pin 101 during Marangoni drying. In some embodiments, the first pusher pin 101 may be employed with 300 mm substrates and the second pusher pin 601 may be employed with 200 mm substrates.

The foregoing description discloses only exemplary embodiments of the invention. Modifications of the above disclosed apparatus and methods which fall within the scope of the invention will be readily apparent to those of ordinary skill in the art. For instance, the present methods and apparatus may be particularly useful for processing a hydrophilic substrate. However, the present methods and apparatus may also be employed for processing another type of substrate, such as a hydrophobic substrate. Exemplary pusher pins 101, 601 of the present invention may be used for 200 mm, 300 mm or other size substrate processing systems such as the Desica Dryer manufactured by the assignee of the present invention, Applied Materials, Inc. of Santa Clara, Calif. The pusher pins 101, 601 may be dimensioned to provide sufficient support to a substrate during transit (e.g., lifting), to wear well and/or to be insensitive to a notch (not shown) on the substrate 401.

Accordingly, while the present invention has been disclosed in connection with exemplary embodiments thereof, it should be understood that other embodiments may fall within the spirit and scope of the invention, as defined by the following claims.

The invention claimed is:

1. A pusher pin for use during substrate drying comprising:
   a shaft portion; and
   a tip portion disposed at an end of the shaft portion, the tip portion having a knife edge of a width of 0.42 inches or less, the tip portion made fit to contact an edge of a substrate and support the substrate with the knife edge;
   wherein the pusher pin is made fit to lift the substrate from a fluid at an angle relative to a vertical axis.

2. The pusher pin of claim 1 wherein the knife edge has a width of about 0.32 inches or less.

3. The pusher pin of claim 1 wherein the knife edged is radiused.

4. The pusher pin of claim 1 wherein the shaft portion and tip portion are laterally offset.

5. The pusher pin of claim 1 wherein the shaft portion and tip portion are integrally formed.

6. The pusher pin of claim 1 wherein the shaft portion and tip portion are separately formed and coupled together.

7. The pusher pin of claim 1 wherein the shaft portion comprises polyetheretherketone and the tip portion comprises polysulfone.

8. A method of drying at least a portion of a substrate located within a fluid, the method comprising:
   contacting an edge of a substrate that is located within the fluid with a pusher pin, the pusher pin having:
   a shaft portion; and
   a tip portion disposed at an end of the shaft portion, the tip portion having a knife edge of a width of 0.42 inches or less, the tip portion made fit to contact the edge of the substrate and support the substrate with the knife edge;
   lifting the substrate from the fluid at an angle relative to a vertical axis with the pusher pin; and
   exposing the substrate to a drying vapor as the substrate is lifted from the fluid.

9. The method of claim 8 wherein the knife edge has a width of about 0.32 inches or less.

10. The method of claim 8 wherein the knife edged is radiused.

11. The method of claim 8 wherein the shaft portion and tip portion are laterally offset.

12. The method of claim 8 wherein the angle is about 9 degrees.

13. The method of claim 8 wherein exposing the substrate to drying vapor includes exposing the substrate to an isopropyl alcohol vapor.

14. The method of claim 8 wherein exposing the substrate to drying vapor includes exposing an interface between the substrate and the fluid to drying vapor.

15. A system for drying a substrate comprising:
   a tank made fit to contain a fluid;
   a drying vapor delivery system made fit to expose the substrate to a drying vapor as the substrate is lifted from the fluid; and
   a pusher pin having:
   a shaft portion; and
   a tip portion disposed at an end of the shaft portion, the tip portion having a knife edge of a width of 0.42 inches or less, the tip portion made fit to contact an edge of the substrate and support the substrate with the knife edge;
   wherein the pusher pin is made fit to lift the substrate from the fluid while the substrate is exposed to drying vapor from the drying vapor delivery system; and
   wherein the pusher pin is made fit to lift the substrate from the fluid at an angle relative to a vertical axis.

16. The system of claim 15 wherein the tank is made fit to completely submerge the substrate in the fluid.

17. The system of claim 15 wherein the knife edge has a width of about 0.32 inches or less.

18. The system of claim 15 wherein the knife edged is radiused.

19. The system of claim 15 wherein the shaft portion and tip portion are laterally offset.

20. The system of claim 15 wherein the angle is about 9 degrees.

21. The system of claim 15 wherein the drying vapor delivery system is made fit to expose the substrate to isopropyl alcohol vapor.

22. The system of claim 15 wherein the drying vapor delivery system is made fit to expose an interface between the substrate and the fluid to drying vapor.

* * * * *